(12) United States Patent
Bailat et al.

(10) Patent No.: US 11,966,201 B2
(45) Date of Patent: Apr. 23, 2024

(54) BLACK-COLOURED PHOTOVOLTAIC DEVICE

(71) Applicant: Nivarox-FAR S.A., Le Locle (CH)

(72) Inventors: Julien Bailat, Bienne (CH); Elisa Favre, Neuchatel (CH); Jan-Willem Schüttauf, Neuchatel (CH)

(73) Assignee: Nivarox-FAR S.A., Le Locle (CH)

( * ) Notice: Subject to any disclaimer, the term of this patent is extended or adjusted under 35 U.S.C. 154(b) by 460 days.

(21) Appl. No.: 17/432,785

(22) PCT Filed: Feb. 21, 2020

(86) PCT No.: PCT/EP2020/054593
§ 371 (c)(1),
(2) Date: Aug. 20, 2021

(87) PCT Pub. No.: WO2020/169789
PCT Pub. Date: Aug. 27, 2020

(65) Prior Publication Data
US 2022/0004149 A1  Jan. 6, 2022

(30) Foreign Application Priority Data
Feb. 21, 2019  (EP) .................................... 19158681

(51) Int. Cl.
*H01L 31/0376* (2006.01)
*G04C 10/02* (2006.01)
(Continued)

(52) U.S. Cl.
CPC ........ *G04C 10/02* (2013.01); *H01L 31/02168* (2013.01); *H01L 31/022466* (2013.01);
(Continued)

(58) Field of Classification Search
CPC ......... H01L 31/03687; H01L 31/03765; H01L 31/1812; H01L 31/204
See application file for complete search history.

(56) References Cited

U.S. PATENT DOCUMENTS

2002/0008192 A1* 1/2002 Isomura .............. H01L 31/0745
257/E31.046
2004/0008588 A1 1/2004 Minami et al.
(Continued)

FOREIGN PATENT DOCUMENTS

CN 102129215 A 7/2011
EP 0 915 523 A2 5/1999
(Continued)

OTHER PUBLICATIONS

Singh ("Analysis of Si/SiGe Heterostructure Solar Cell") , Journal of Energy, vol. 2014, Article ID 946406, 7 pages http://dx.doi.org/10.1155/2014/946406 (Year: 2014).*
(Continued)

*Primary Examiner* — Angelo Trivisonno
(74) *Attorney, Agent, or Firm* — Oblon, McClelland, Maier & Neustadt, L.L.P.

(57) ABSTRACT

A photovoltaic device includes an electrically-conductive front contact layer; an electrically-conductive back contact layer, the back contact layer being intended to be situated further from a source of incident light than the front contact layer; and a semiconductor-based PIN junction having a substantially amorphous intrinsic silicon layer sandwiched between a P-type doped semiconductor layer and an N-type doped semiconductor layer. The layer of the PIN junction situated closest to the back contact layer is a silicon-germanium alloy layer including at least 2 mol % of germanium.

16 Claims, 3 Drawing Sheets

(51) Int. Cl.
*H01L 31/0216* (2014.01)
*H01L 31/0224* (2006.01)
*H01L 31/0368* (2006.01)
*H01L 31/075* (2012.01)
*H01L 31/18* (2006.01)
*H01L 31/20* (2006.01)

(52) U.S. Cl.
CPC .. *H01L 31/03687* (2013.01); *H01L 31/03765* (2013.01); *H01L 31/075* (2013.01); *H01L 31/1812* (2013.01); *H01L 31/204* (2013.01)

(56) References Cited

U.S. PATENT DOCUMENTS

2010/0059119 A1* 3/2010 Yun .................... H01L 31/1812
                                                              438/73
2016/0043246 A1    2/2016 Nagano

FOREIGN PATENT DOCUMENTS

| EP | 2 363 766 | A2 | 9/2011 |
|---|---|---|---|
| JP | 6-318719 | A | 11/1994 |
| JP | 7-202231 | A | 8/1995 |
| JP | 8-46229 | A | 2/1996 |
| JP | 11-220154 | A | 8/1999 |
| JP | 2004-45105 | A | 2/2004 |
| JP | 3491977 | B2 | 2/2004 |
| JP | 2011-149710 | A | 8/2011 |
| JP | 2012-164775 | A | 8/2012 |

OTHER PUBLICATIONS

Indian Office Action dated Apr. 21, 2022 in Indian Patent Application No. 202147037639, 6 pages.
Ignatio Benigno, et al., "Effect of Intrinsic Layer Energy Gap and Thicknesses Optimization on the Efficiency of p-i-n Amorphous Silicon Solar Cell" IPTEK, Journal of Science, vol. 2, No. 3, 2017, (eISSN: 2337-8530), pp. 37-42.
Combined Office Action and Search Report dated Aug. 16, 2023, in Chinese Patent Application No. 202080029796.7, with English translation, 9 pages.
Notice of the Reason for Refusal dated Oct. 4, 2022 in Japanese Patent Application No. 2021-549244 (with English language translation), 8 pages.
International Search Report dated May 26, 2020 in PCT/EP2020/054593 filed Feb. 21, 2020, 3 pages.

* cited by examiner

BLACK-COLOURED PHOTOVOLTAIC DEVICE

TECHNICAL FIELD

The present invention relates to the technical field of photovoltaic (PV) devices, for instance for powering electronic timepieces or electronic devices such as calculators, or for larger-scale solar power generation.

STATE OF THE ART

Typical solar cells based on thin-film amorphous silicon exhibit a reddish/aubergine colour, since they reflect light with wavelengths longer than about 650 nm. This is often perceived as inaesthetic and is hence undesirable for certain applications, despite their excellent efficiency and open circuit voltage, particularly under indoor lighting conditions (LED, tube lamp, incandescent bulbs etc.).

In the particular case of electrical or electronic timepieces, a deep black coloured dial is desirable in order to maximise the legibility of the time display, whether it incorporates traditional hands or a digital display. In the case of electrical or electronic timepieces, conventional thin-film solar cells can be integrated into the dial in order to power the timepiece and to recharge its battery, however the reddish/aubergine colour of the cells is usually undesirable, limiting the market penetration of such timepieces. Crystalline silicon solar cells (polycrystalline, monocrystalline, microcrystalline etc.) have a blacker colour than amorphous silicon cells, but are less efficient under indoor lighting conditions due to their absorption spectrum, and are hence less suitable for indoor applications such as timepieces.

The typical solution to this problem is to at least partially hide the amorphous solar cell, e.g. by coating it with conventional black lacquer or by a semi-transparent dial situated over the solar cell. In respect of this latter case, documents JP2000131463 and JP2002148360 disclose arrangements in which the front dial plate situated in front of the solar cell comprises openings, e.g. serving as indexes, which allow a small amount of light to reach the solar cell hidden by the dial plate. This enables the bulk of the dial to be finished traditionally and coloured according to the watchmaker's needs, but severely limits the amount of light reaching the underlying solar cell. As a result, electricity production is low, which limits the applicability of such arrangements to very low-power-consumption watches.

An aim of the present invention is hence to at least partially overcome the above-mentioned drawbacks of the prior art.

DISCLOSURE OF THE INVENTION

More specifically, the invention relates to a photovoltaic device comprising:
- an electrically-conductive front contact layer, e.g. comprising a transparent conductive oxide or similar;
- an electrically-conductive back contact layer, e.g. comprising a metal layer, a transparent conductive oxide or similar, said back contact layer being intended to be situated further from a source of incident light than said front contact layer, so as to define "front" and "back" sides to the device;
- a semiconductor-based PIN junction comprising a substantially amorphous intrinsic silicon layer (which may be hydrogenated a-Si:H or unhydrogenated a-Si) sandwiched between a P-type semiconductor layer and an N-type semiconductor layer. The PIN junction can be arranged in either orientation, i.e. with the P-type or N-type layer closest to the front side of the device.

According to the invention, the layer of said PIN junction situated closest to said back contact layer (i.e. of these three layers, the layer that is closest to the back contact) is a silicon-germanium alloy layer comprising at least 2 mol % of germanium.

Si—Ge alloy absorbs visible light particularly strongly in the red wavelength range, i.e. in the wavelength ranges normally transmitted by amorphous silicon-based devices. This results in a deep black colour for the PV device, compensating for the typically red, aubergine or violet colour that amorphous silicon PV devices have, rendering it particularly useful for inconspicuous use when integrated into watches (e.g. when used as a dial, or integrated into the bezel or other visible parts of the watch), calculators, smartphones and other portable electronic devices, without needing to be partially hidden to retain high-quality aesthetics. Since amorphous cells are more efficient and have a higher open circuit voltage than crystalline cells when exposed to typical indoor lighting (from LED's, fluorescent tubes, etc.), this permits a significant increase the amount of electrical power generated for black-coloured photovoltaic devices compared to prior art crystalline cell solutions.

Advantageously, said silicon-germanium alloy comprises at least 10 mol % germanium, further preferably 15% to 25% germanium, further preferably substantially 20% germanium.

Advantageously, the device further comprises a substantially transparent anti-reflective layer (such as a layer of silicon oxynitride) situated on the light-incident side of said front contact layer, to help in reducing specular reflections. This anti-reflective layer may comprise a multilayer construction.

Advantageously, said anti-reflective layer exhibits an index of refraction lower than the index of refraction of said front contact layer, further helping to reduce specular reflections.

Advantageously, the surface of the silicon-germanium alloy layer facing towards the front contact layer has a certain roughness. This roughness can be formed e.g. by being transposed through the layer stack from a textured front (or back) contact layer, depending on whether the stack is deposited from the back side or the front side (i.e. on whether the device has a front-side substrate or a back-side substrate). This texture helps diffusion of light at this interface, reducing reflection and deepening the blackness of the device. Typical values for the rms roughness of the front (or back) contact layer are in the range of 10-500 nm, more particularly 20-300 nm.

In one construction, the device may comprise a substantially-transparent substrate situated on the light-incident side of said front contact layer, in which case it is advantageous to provide an anti-reflective coating on the front side of the substrate. If this anti-reflective coating exhibits an index of refraction lower than the index of refraction of said substrate, specular reflections are minimised. This anti-reflective layer may comprise a multilayer construction.

In this front-substrate construction, front contact layer may advantageously comprise zinc oxide and/or tin oxide, which has a textured surface as a consequence of its deposition. This texture is then transposed through the subsequently-deposited layers, to the interface between the I-type layer of the PV junction and the silicon-germanium alloy layer. Again, this texture helps diffusion of light at this interface, reducing reflection and deepening the blackness of the device.

In an alternative construction, the device may comprise a substrate arranged directly or indirectly on a surface of said back contact layer facing away from the light-incident side of said back contact layer.

In this back-substrate construction, the back contact layer can advantageously comprise zinc oxide and/or tin oxide, for the same reasons as above. Again, this causes the front-facing surface of the silicon-germanium alloy layer to be textured, improving diffusion of light at its interface with the I-type layer.

Advantageously, the layers of the PIN or NIP junction other than that based on silicon-germanium alloy are based on amorphous silicon (a-Si). This is cheap, well-understood technology, and a synergy exists between a-Si-based layers and the underlying Si—Ge layer, since the latter absorbs the red wavelengths of light typically not absorbed by a-Si. For completeness, it is noted that, in the case in which the PIN junction has its P-type layer situated towards the front (light-incident) side of the device, the P and I type layers are based on a-Si and the Si—Ge layer is N-type doped, and in the opposite case, the N-type layer is situated towards the front with the N and I type layers based on a-Si and the Si—Ge layer being P-type doped.

Although the PV device of the invention can be widely applied without limitation, it can particularly advantageously be incorporated into a timepiece, forming e.g. at least part of the dial and/or of the bezel of said timepiece.

Finally, the invention relates to a method of manufacturing a photovoltaic device as described above, wherein said silicon-germanium layer is deposited by plasma-assisted chemical vapour deposition under the following conditions for the dimensions of the specific reactor type used in this case (13.56 MHz, 15 mm inter-electrode distance, 45×55 cm electrode surface dimensions):

silane flow 30-50 sccm;
germane flow 6-10 sccm;
hydrogen flow 1200-1500 sccm
phosphene flow 0.5-1.5 sccm (for N-type doping), or diborane flow 0.5-1.5 sccm (for P-type doping)
pressure 3.0-3.5 mbar;
plasma power 100-150 W.

BRIEF DESCRIPTION OF THE DRAWINGS

Further details of the invention will appear more clearly upon reading the description below, in connection with the following figures which illustrate.

EMBODIMENTS OF THE INVENTION

Figure 1:
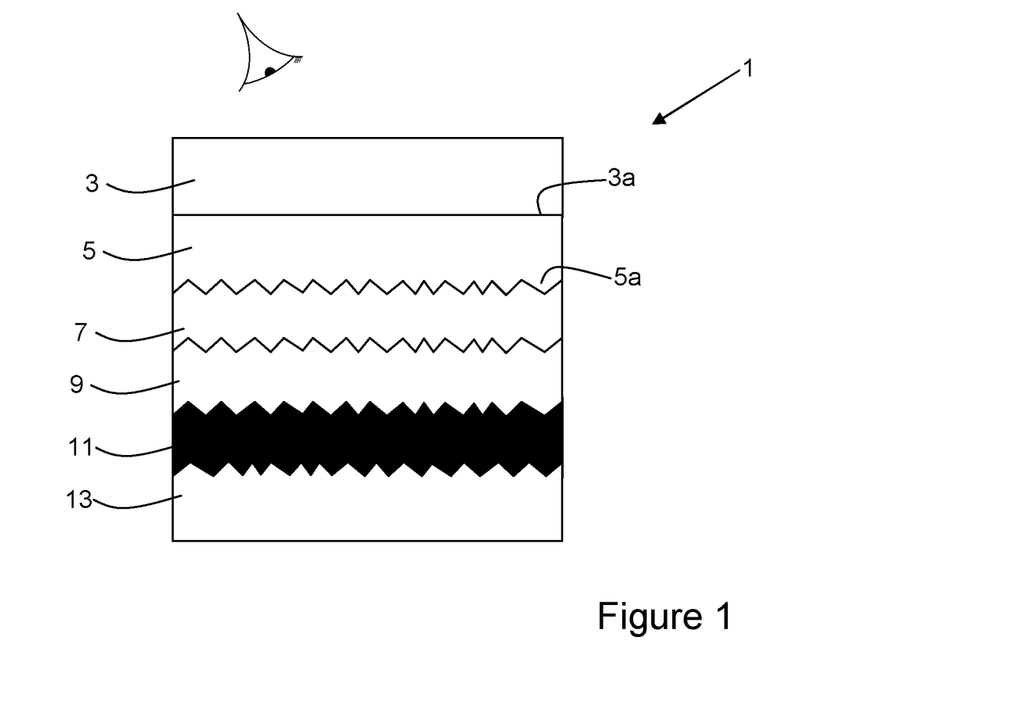
FIG. 1: a schematic cross-section of a PV device according to the invention, with a front-side substrate.

FIG. 1 illustrates a schematic cross section of a variant of the simplest form of a black-coloured photovoltaic (PV) device 1 according to the invention.

PV device 1 comprises a substantially-transparent substrate 3 of any desired thickness, which may be made of glass, polymer, a transparent ceramic such as sapphire or alumina, a glass-ceramic or any other convenient material. Depending on the material and its thickness, it may be substantially rigid or flexible, and may be flat, curved or formed into any desired shape. In the present text, "substantially transparent" should be understood as exhibiting a transmissivity of at least 95% of visible light (350-750 nm), and all indexes of refraction relate to visible light wavelengths.

As is the convention in the field, device 1 has a front side, indicated schematically by means of the eye symbol representing the point of view of an observer looking towards the front side of the device 1 which is intended to receive incident light, and a back side which is opposite to the front side and is intended to be shaded in use.

Upon a first face 3a of the substrate 3, which faces away from the front side, is provided a substantially transparent front contact 5. This front contact 5 may be directly situated upon said first face 3a as illustrated in FIG. 1, or may be indirectly situated thereupon, with one or more supplemental layers interposed between the substrate 3 and the front contact 5, as is generally known and will be discussed in more detail below.

Front contact 5 may be for instance a layer of doped or undoped transparent conductive oxide, e.g. zinc oxide formed upon the first surface 3a by means of chemical vapour deposition (CVD), physical vapour deposition (PVD) or similar, which will cause the surface 5a of the front contact layer 5 which faces away from the substrate 3a to exhibit a texture comprising a plurality of pyramidal forms, as represented schematically by means of a zigzag line. Another particularly suitable material for this layer is CVD-deposited tin oxide, which is transparent and exhibits a more rounded surface morphology than the sharply-defined pyramidal forms of zinc oxide. Other substances such as indium tin oxide (ITO), or others can equally be used, see for instance the publication *Transparent Conducting Oxides—An Up-To-Date Overview*, Andreas Stadler, Materials (Basel). 2012 April; 5(4): 661-683. Typical sheet resistances are in the region of 5-100 Ohm/square.

Although this texture is not obligatory, it is desirable as will become apparent below, and it is also possible to texture said surface 5a in a separate step after depositing a different transparent conductive material that does not inherently form a textured surface during deposition, such as a transparent conductive polymer or similar, which will follow the surface morphology of the underlying layer. This texturing can be carried out mechanically (e.g. by machining, grinding, abrasive brushes, sand or bead blasting, or similar), by means of ion etching, laser etching or ablation, or by chemical etching. It is unimportant how the texture (if present) is formed, but ideally the texture should have a minimum rms roughness value in the range of 20-300 nm, and may be stochastic or non-stochastic depending on how it is formed. RMS roughness is described in the standard ASME B46.1, and is hence well-known to the skilled person.

Alternatively, the surface 3a of the substrate may itself be textured, this texture being transferred to surface 5a of the textured layer 5 even if it is made of a material that does not inherently form a textured surface.

Irrespective of how the front contact layer 5 is formed, its thickness is ideally between 0.1 and 5 µm thick, preferably between 1.5 and 2 µm thick.

Directly or indirectly upon said surface 5a of the front contact layer 5 is situated a PIN or NIP junction, as is generally known. For instance, layer 7 may be P-doped amorphous silicon, layer 9 is an intrinsic amorphous silicon layer (a-Si or a-Si:H), and layer 11 is an N-doped semiconductor layer as will be discussed in more detail below. The opposite arrangement is also possible, with layer 7 being an N-type amorphous silicon layer and layer 11 being a P-type semiconductor layer. In the case in which the surface 5a is textured, the texture is transposed throughout the subsequently-deposited layers, as has been represented schematically by the zigzag interfaces between the layers. In case of doubt, an "amorphous" or "substantially amorphous" layer can be parametrised as having a Raman crystallinity of less than 5%.

A back contact 13 of metal or other conductive substance (e.g. a transparent conductive oxide or similar) is situated on the layer 11, the various layers being patterned and interconnected as desired and is generally known.

According to the invention, the layer 11 of the PIN or NIP junction situated closest towards the back contact 13 comprises appropriately-doped silicon-germanium alloy, in which the molar percentage of germanium is at least 2%, preferably 10% to 30% germanium, further preferably 15% to 25% germanium, further preferably substantially 20% germanium, the balance being substantially all silicon (and hydrogen in the case in which the layer is hydrogenated SiGe:H). This layer typically has a thickness of between 10 and 500 nm, more particularly between 30 and 200 nm, and is typically deposited by CVD with the following deposition parameters for N-type SiGe:H:

| Layer type | [SiH$_4$] flow (sccm) | [GeH$_4$] flow (sccm) | [H$_2$] flow (sccm) | [PH$_3$] flow (sccm) | pressure (mbar) | Pressure (W) | Layer thickness (nm) |
|---|---|---|---|---|---|---|---|
| (n) SiGe:H | 30-50 | 6-10 | 1200-1500 | 0.5-1.5 | 3.0-3.5 | 100-150 | 30-200 |

In the case of P-type SiGe:H, the parameters are similar, although diborane or other P-type dopant is used instead of phosphine, and the flow rate adapted in consequence.

Silicon-germanium alloy absorbs visible light wavelengths particularly strongly, notably in the red wavelength range (longer than 650 nm wavelength). This wavelength range typically does not get absorbed in a conventional thin-film amorphous silicon PV cell, which absorbs typically in the 350 nm to 650 nm wavelength range. Furthermore, Si—Ge alloy has a similar index of refraction to a-Si:H in the order of 3-4, which is typically significantly in excess of the index of refraction of other layers situated towards the front side of the PV device 1. As a result, the Si—Ge layer 11 does not add an additional reflection at the a-Si/Si—Ge interface. enabling the remaining red light to directly enter the Si—Ge layer. Furthermore, the front texture enhances the recycling of the light into the absorbing layer by multiple reflections and thus resulting in the absorption a maximum of light, enabling a deep black cell to be produced despite the intrinsic layer being of amorphous silicon, which typically does not absorb red wavelengths (>700 nm) and hence normally has a purple/aubergine/reddish colour. In essence, the invention permits the advantages of an amorphous cell for portable applications (open-circuit voltage, efficiency under indoor lighting conditions), while providing a desirable deep black colour.

This variant of a PV device 1 is formed by depositing the desired sequence of layers from the transparent substrate 3 towards the back contact 13 as is generally known, by any suitable process or processes appropriate for each individual layer. To this end, variants of chemical vapour deposition (CVD with or without plasma assistance, etc.), physical vapour deposition (PVD, sputtering, etc.), spin coating, spray coating and similar can be applied as is generally known in function of the materials used.

Once constructed, the PV device 1 can be encapsulated if required.

This configuration also provides a particularly robust top surface of the PV device 1, which can be easily handled and cleaned by conventional means.

Figure 2:
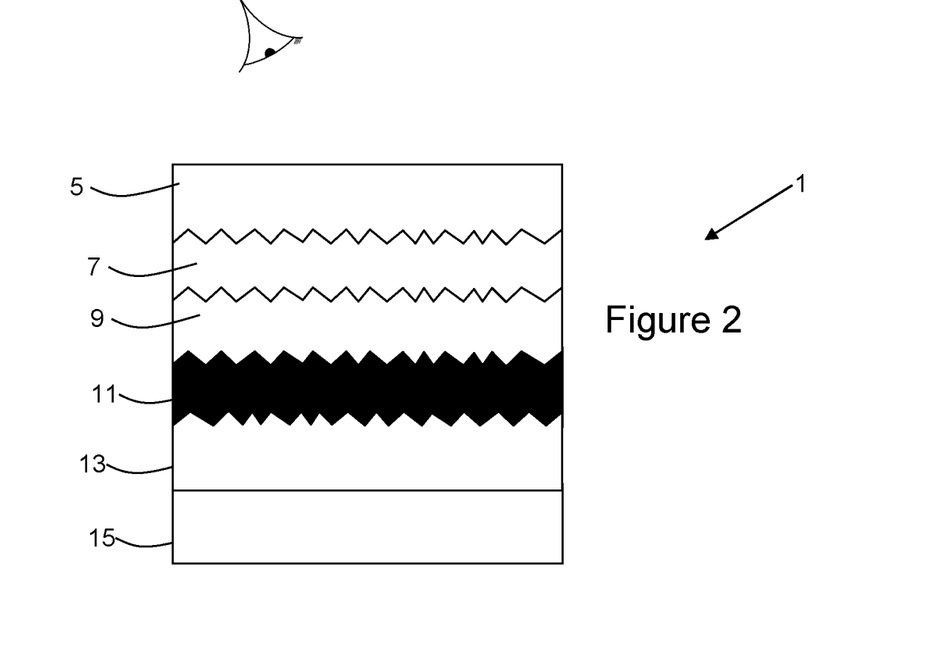
FIG. 2: a schematic cross-section of a further PV device according to the invention, with a back-side substrate.

FIG. 2 illustrates a further variant of a PV device 1, constructed from a back substrate 15 towards the front contact 5. In this embodiment, the substrate 15 may be of any convenient material, whether transparent or opaque, and the layers are deposited in the sequence of reference signs 13-11-9-7-5. These layers are unchanged from the embodiment of FIG. 1, and one or more further layers, such as a protective layer, may be deposited upon the front contact 5.

In this construction, it is advantageous for the back contact 13 to be of a substance such as zinc oxide or tin oxide, exhibiting a surface texture as described above automatically and as a function of its deposition process. Alternatively, the front surface of the back contact 13 or of the substrate 15 can be textured as described above, and any suitable conductive materials, including metals, can be used for the back contact 13. This texture ensures that the front-side interface of the Si—Ge layer 11 is also textured, giving the same advantages in maximising light diffusion as described above, although it is not obligatory.

Figure 3:
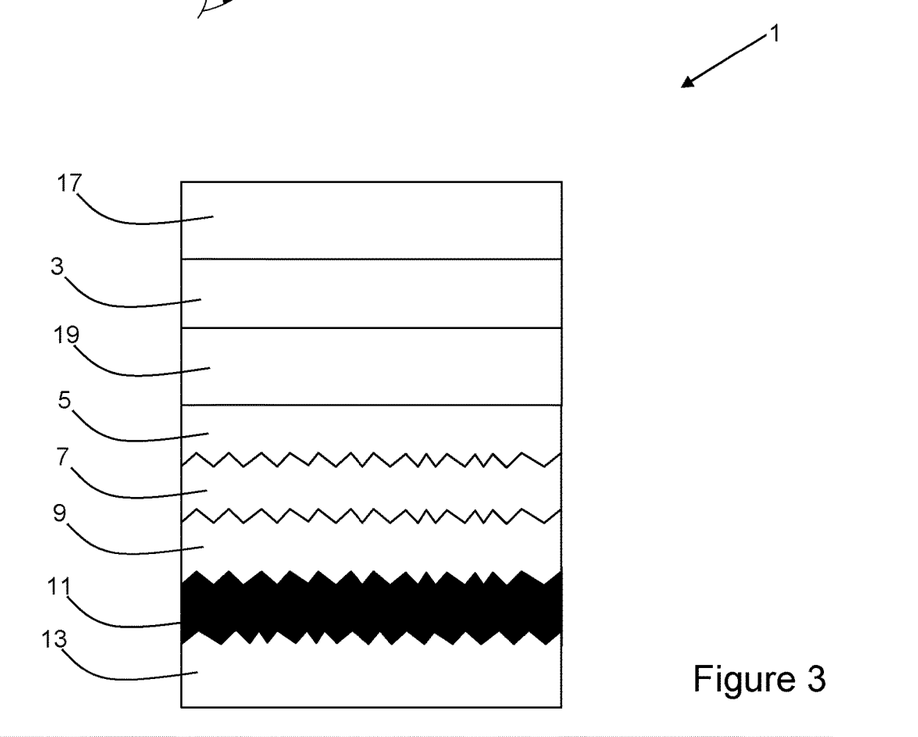
FIG. 3: a schematic cross-section of a further PV device according to the invention.

FIG. 3 illustrates an advantageous variant of the embodiment of FIG. 1, in which further layers have been incorporated to improve the blackness of the PV device 1. The same principles can be applied independently of the position of the substrate and can hence be directly applied to the embodiment of FIG. 2, mutatis mutandis. It is hence not necessary to describe a corresponding embodiment in detail.

The embodiment of FIG. 3 applies two strategies to further improve the blackness of the PV device 1, which can be applied individually or in combination, as illustrated.

The first measure to further deepen the colour is the presence of an anti-reflective coating 17 comprising one or more layers applied on the surface of the substrate 3 facing towards the intended viewing direction, i.e. facing away from the Si—Ge alloy layer 11. This anti-reflective coating 17 may also have anti-scratch and anti-abrasion properties, such coatings being well-known in and of themselves, particularly in the field of eye glasses to reduce specular reflections and hence reduce shine. Examples thereof are disclosed in e.g. U.S. Pat. No. 9,726,786, WO2008112047, DE102015114877, U.S. Pat. No. 9,817,155 and innumerable others. Alternatively, an additional anti-scratch coating (not illustrated) may be provided upon the anti-reflective coating 11 if this latter is likely to be exposed to scratches in use and has poor resistance thereto.

In the context of the present invention, the anti-reflective coating 17 advantageously has a refractive index lower than that of the immediately-underlying layer, which in the case of the embodiment of FIG. 3 is the substrate 3. This to reduce back-reflections and hence to deepen the colour.

The second measure to deepen the colour is a further anti-reflective layer 19, interposed between the substrate 3 and the front contact layer 5. This layer typically has a refractive index with a value situated between that of the substrate 3 and the textured layer 5, and may for instance be a layer of silicon oxynitride with a thickness of between 10 and 200 nm, and more preferably between 70 and 90 nm. This layer may also be a multilayer exhibiting a graded index of refraction, increasing through the thickness of the layer.

Further advantageously, if the index of refraction increases progressively through the layer stack from the front side to the I-layer of the PIN or NIP junction, reflections are further reduced. For instance, the following values of indexes of refraction may be used:

| Layer | Index of Refraction for visible light | Material example |
|---|---|---|
| Anti-reflective coating 17 | 1.3 | MgF$_2$ |
| Substrate 3 | 1.5 | Glass |
| Anti-reflective layer 19 | 1.73 | Silicon oxynitride |
| Front contact 5 | 2 | Zinc oxide |
| Frontmost two layers of PIN/NIP junction | 4.3 | a-Si |

The effects of the invention have been demonstrated experimentally by fabricating a series of PV devices 1 which have the following characteristics.

Device A: a state of the art PV cell with the structure of FIG. 1, except that layer 11 comprises n-type μc-Si:H and SiOx:H. The layer structure is as follows:

| Layer | Material | Thickness |
|---|---|---|
| Substrate 3 | Glass | 0.5 mm |
| Front contact 5 | ZnO | 1.5-2.0 μm |
| PV junction layer 5 | P-type a-SI:H | 12 nm |
| Intrinsic layer 7 | I-type a-Si:H | 380 nm |
| PV junction layer 11 | N-type μc-Si:H + n-SiOx | (16 + 26) nm |
| Back contact 13 | Al/NiV | 200 nm |

Device B: a PV device 1 according to the invention, with the structure of FIG. 1. The layer structure is as follows:

| Layer | Material | Thickness |
|---|---|---|
| Substrate 3 | Glass | 0.5 mm |
| Front contact 5 | ZnO | 1.5-2.0 μm |
| PV junction layer 5 | P-type a-SI:H | 12 nm |
| Intrinsic layer 7 | I-type a-Si:H | 380 nm |
| PV junction layer 11 | N-type SiGe:H, Si:Ge ratio approximately 5:1 | 30 nm |
| Back contact 13 | Al/NiV | 200 nm |

Device C: a PV device 1 according to the invention, with the structure of FIG. 3 but excluding the antireflective layer 19. The layer structure is as follows:

| Layer | Material | Thickness |
|---|---|---|
| Anti-reflective coating 17 | MgF$_2$ | 95 nm |
| Substrate 3 | Glass | 0.5 mm |
| Front contact 5 | ZnO | 1.5-2.0 μm |
| PV junction layer 5 | P-type a-SI:H | 12 nm |
| Intrinsic layer 7 | I-type a-Si:H | 380 nm |
| PV junction layer 11 | N-type SiGe:H, Si:Ge ratio approximately 5:1 | 30 nm |
| Back contact 13 | Al/NiV | 200 nm |

Device D: a PV device 1 according to the invention, with the structure of FIG. 3 but excluding the antireflective coating 17. The layer structure is as follows:

| Layer | Material | Thickness |
|---|---|---|
| Substrate 3 | Glass | 0.5 mm |
| Anti-reflective layer 19 | SiNxOy | 80 nm |
| Front contact 5 | ZnO | 1.5-2.0 μm |
| PV junction layer 5 | P-type a-SI:H | 12 nm |
| Intrinsic layer 7 | I-type a-Si:H | 380 nm |
| PV junction layer 11 | N-type SiGe:H, Si:Ge ratio approximately 5:1 | 30 nm |
| Back contact 13 | Al/NiV | 200 nm |

Device E: a PV device 1 according to the invention, with the structure of FIG. 3. The layer structure is as follows:

| Layer | Material | Thickness |
|---|---|---|
| Anti-reflective coating 17 | MgF$_2$ | 95 nm |
| Substrate 3 | Glass | 0.5 mm |
| Anti-reflective layer 19 | SiNxOy | 80 nm |
| Front contact 5 | ZnO | 1.5-2.0 μm |
| PV junction layer 5 | P-type a-SI:H | 12 nm |
| Intrinsic layer 7 | I-type a-Si:H | 380 nm |
| PV junction layer 11 | N-type SiGe:H, Si:Ge ratio approximately 5:1 | 30 nm |
| Back contact 13 | Al/NiV | 200 nm |

The colour parameters for each cell were measured in the L*a*b* system, which is perceptually uniform and correlates with the human eye perception. In this model, L* represents the luminance (from L*=0, black to L*=100, white), a* is the green-red scale (from a*=−128, green to a*=+127, red) and b* is the blue-yellow scale (from b*=−128, blue to b*=+127, yellow). Thus, a perfect black is defined by L*=a*=b*=0. The samples are measured simultaneously in SCI mode, i.e. the specular component of the reflection is included, and in SCE mode, i.e. only the diffuse component of the reflection is included. An antireflective coating helps reducing the specular component of the reflection, thus its effect is seen in the SCI mode measurements reported below. On the other hand, modifying the layers inside of the stack mostly affects the diffuse component of the reflection, thus its effect is seen in the SCE mode measurements. A standard D65 illuminant was used, with a 10° observer.

In order to quantify how black the colour obtained is, the parameter Mc, called "jetness" has been defined as follows:

$$Mc = 100 \times \left[\log\left(\frac{Xn}{X}\right) - \log\left(\frac{Zn}{Z}\right) + \log\left(\frac{Yn}{Y}\right)\right]$$

Wherein $$Y = Y_n . f^{-1}\left(\frac{L^* + 16}{116}\right) X =$$

$$X_n . f^{-1}\left(\frac{L^* + 16}{116} + \frac{a^*}{500}\right) Z = Z_n . f^{-1}\left(\frac{L^* + 16}{116} - \frac{b^*}{200}\right)$$

Where $$f^{-1}(t) = \begin{cases} t^3 & \text{if } t > \frac{6}{29} \\ 3\left(\frac{6}{29}\right)^2\left(t - \frac{4}{29}\right) & \text{otherwise} \end{cases}$$

And where L*, a*, b* are the L*a*b* colour parameters measured,

Xn, Yn and Zn are the components of reference white (n=neutral). For Mc calculation, Xn=94.811, Yn=100.000 and Zn=107.304 were used. X, Y and Z are directly calculated by the spectrophotometer during measurements at the same time as L*, a* and b*.

As can be seen from this definition, the higher the "jetness" Mc, the blacker the sample.

The results obtained were as follows:

|  | SCI | | | | SCE | | | |
|---|---|---|---|---|---|---|---|---|
|  | L* | a* | b* | Mc | L* | a* | b* | Mc |
| Device A | 29-31 | 1.5-3.0 | −1.5-0.0 | 120-125 | 4-12 | 6.0-9.0 | 1.5-4.5 | 185-190 |
| Device B | 29-30 | 0.0-1.5 | −2.0--1.2 | 120-125 | 4-6 | 0.0-4.0 | 1.3-2.6 | 190-225 |
| Device C | 21-22 | 0.5-2.0 | −1.0-0.0 | 143-150 | 4-7 | 0.5-4.0 | 1.8-3.8 | 190-225 |
| Device D | 24-26 | 1.0-2.5 | −2.5--0.5 | 133-140 | 4-6 | 0.5-4.5 | 2.0-3.5 | 190-225 |
| Device E | 13-15 | 2.5-5.0 | −1.5-2.0 | 165-180 | 4-6 | 0.5-4.5 | 2.0-4.0 | 190-225 |

In this table, the range of colour values due to the SiGe alloy layer 11 varies in function of the thickness of this layer, which varies due to controlled variations.

It can clearly be seen that the "jetness" of the devices 1 is significantly improved by means of using SiGe alloy for the rearmost photovoltaic junction layer 11, and that the use of the antireflective coating 17 and/or the antireflective layer 19 improves the blackness, the combination of both measures being particularly effective when including the specular component of reflection, as can be seen from the reduced L* value in the SCI data.

Figure 4:
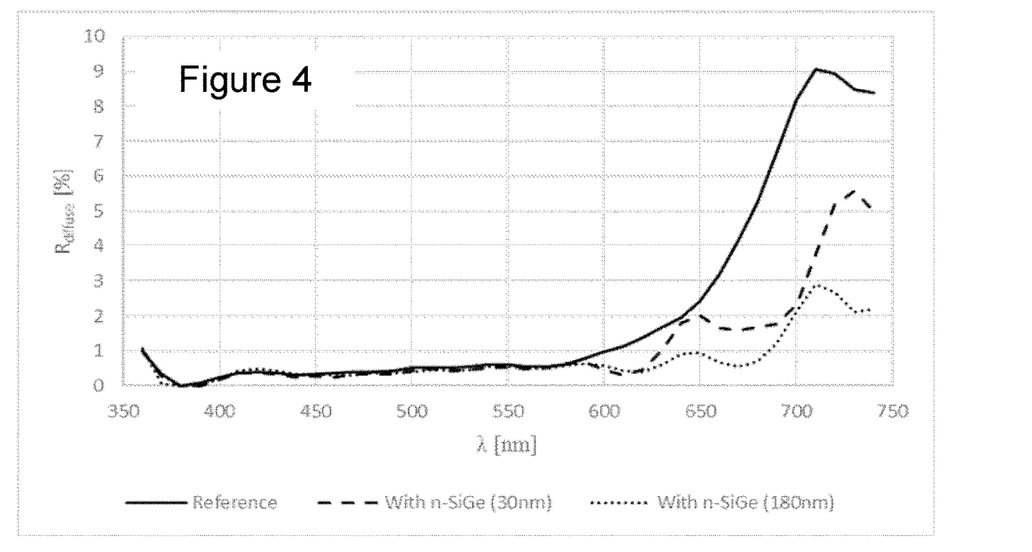
FIG. 4: a graph of diffuse reflection in function of the wavelength of incident light for a conventional cell and a cell according to FIG. 3 with two different thicknesses of absorption layer.

FIG. 4 illustrates the impact of using various thicknesses of n-SiGe for layer 11 in a device 1 with the structure of device E above, compared with a reference in which layer 11 is the conventional N-type layer stack. As can clearly be seen, the difference in diffuse reflectivity $R_{\text{diffuse}}$ is highly marked above about 590 nm wavelength, and a 180 nm thick absorption layer 11 absorbs more strongly than a 30 nm thick layer.

Figure 5:
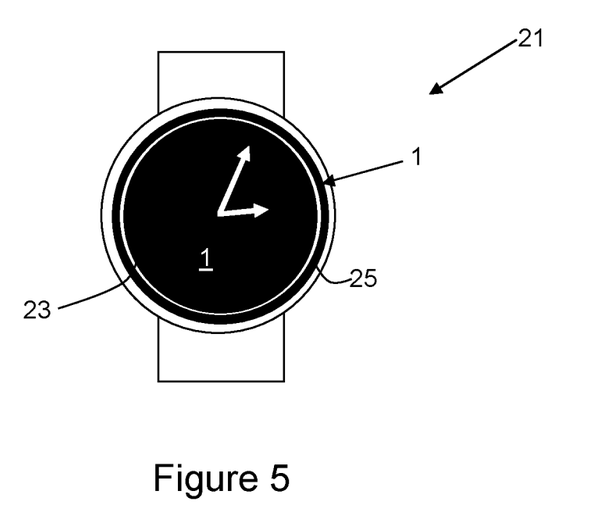
FIG. 5: a schematic representation of a timepiece comprising a PV device according to the invention.

FIG. 5 illustrates schematically a timepiece 21 comprising two PV devices according to the invention. A first of these forms all or part of the dial 23 of the timepiece, the other being integrated into the bezel 25. It goes without saying that any particular timepiece can incorporate either one of these PV devices, and that e.g. indexes can be provided on the surface of a PV device 1 serving as a dial 23. Also, it is possible to incorporate the PV device 1 of the invention into the watch case, the bracelet and so on, or into other devices such as calculators, the casings of smartphones, tablet computers and so on.

Finally, it is noted that, whereas a device 1 of type A typically has a power output of 9 mW/cm2, a device of type E has a power output of about 8 mW/cm2, which is a relatively small reduction compared to e.g. masking the PV device with a partially-transparent watch dial as in the prior art discussed in the introduction.

Although the invention has been described in terms of specific embodiments, variations thereto are possible without departing from the scope of the appended claims.

The invention claimed is:

1. A photovoltaic device comprising:
   an electrically-conductive front contact layer;
   an electrically-conductive back contact layer, said back contact layer being situated further from a source of incident light than said front contact layer; and
   a semiconductor-based PIN junction comprising a substantially amorphous intrinsic silicon layer sandwiched between a P-type doped semiconductor layer and an N-type doped semiconductor layer,
   wherein the layer of said PIN junction situated closest to said back contact layer is a silicon-germanium alloy layer comprising at least 2 mol % of germanium.

2. The photovoltaic device according to claim 1, wherein said silicon-germanium layer comprises at least 10 mol % germanium.

3. The photovoltaic device according to claim 1, further comprising an anti-reflective layer situated on a light-incident side of said front contact layer.

4. The photovoltaic device according to claim 3, wherein said anti-reflective layer exhibits an index of refraction lower than an index of refraction of said front contact layer.

5. The photovoltaic device according to claim 1, wherein a surface of the silicon-germanium alloy layer facing towards the front contact layer has an rms roughness of at least 10 nm.

6. The photovoltaic device according to claim 1, further comprising a substantially-transparent substrate situated on a light-incident side of said front contact layer.

7. The photovoltaic device according to claim 6, further comprising an anti-reflective coating disposed on a front side of said substantially-transparent substrate, said anti-reflective coating exhibiting an index of refraction lower than an index of refraction of said substrate.

8. The photovoltaic device according to claim 5, wherein said front contact layer comprises at least one of zinc oxide and tin oxide.

9. The photovoltaic device according to claim 1, further comprising a substrate arranged on a surface of said back contact layer facing away from a light-incident side of said back contact layer.

10. The photovoltaic device according to claim 9, wherein said back contact layer comprises at least one of zinc oxide and tin oxide.

11. The photovoltaic device according to claim 1, wherein the layers of the PIN junction other than that based on silicon-germanium alloy are based on amorphous silicon.

12. A timepiece comprising a photovoltaic device according to claim 1.

13. The timepiece according to claim 12, wherein said photovoltaic device forms at least part of a dial or a bezel comprised by said timepiece.

14. A method of manufacturing a photovoltaic device according to claim 1 wherein said silicon-germanium layer is deposited by plasma-assisted chemical vapour deposition under the following conditions for a reactor of 13.56 MHz plasma excitation frequency, 15 mm inter-electrode distance, and 45×55 cm electrode surface dimensions:
- silane flow 30-50 sccm;
- germane flow 6-10 sccm;
- hydrogen flow 1200-1500 sccm;
- phosphene flow 0.5-1.5 sccm, or diborane flow 0.5-1.5 sccm;
- pressure 3.0-3.5 mbar; and
- plasma power 100-150 W.

15. The photovoltaic device according to claim 1, wherein said silicon-germanium alloy layer comprises 15% to 25% germanium.

16. The photovoltaic device according to claim 1, wherein said silicon-germanium alloy layer comprises substantially 20% germanium.

* * * * *